(12) United States Patent
Kurchuk et al.

(10) Patent No.: US 9,184,757 B2
(45) Date of Patent: *Nov. 10, 2015

(54) SYSTEMS, DEVICES, AND METHODS FOR CONTINUOUS-TIME DIGITAL SIGNAL PROCESSING AND SIGNAL REPRESENTATION

(71) Applicants: THE TRUSTEES OF COLUMBIA UNIVERSITY IN THE CITY OF NEW YORK, New York, NY (US); COMMISSARIAT A L'ENERGIE ATOMIQUE, Paris (FR)

(72) Inventors: Mariya Kurchuk, Bridgewater, NJ (US); Colin Weltin-Wu, Berkeley, CA (US); Yannis Tsividis, New York, NY (US); Dominique Morche, Meylan (FR); David Lachartre, Montbonnot (FR)

(73) Assignees: COMMISSARIAT A L'ENERGIE ATOMIQUE, Paris (FR); THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,602

(22) Filed: May 2, 2014

(65) Prior Publication Data

US 2014/0241554 A1    Aug. 28, 2014

Related U.S. Application Data

(63) Continuation of application No. 13/501,197, filed as application No. PCT/US2010/052316 on Oct. 12, 2010, now Pat. No. 8,749,421.

(60) Provisional application No. 61/250,749, filed on Oct. 12, 2009.

(51) Int. Cl.
*H03M 1/12* (2006.01)
*H03M 1/06* (2006.01)
(Continued)

(52) U.S. Cl.
CPC .......... *H03M 1/0697* (2013.01); *H03M 1/0854* (2013.01); *H03M 1/12* (2013.01);
(Continued)

(58) Field of Classification Search
CPC ... H03M 1/1215; H03M 1/125; H03M 1/127; H03M 1/36; H03M 1/361; H03M 1/74
USPC .......................................... 341/155, 158–160
See application file for complete search history.

(56) References Cited

U.S. PATENT DOCUMENTS

| | | | | |
|---|---|---|---|---|
| 4,006,454 A | * | 2/1977 | Beseke et al. | 714/709 |
| 5,831,567 A | * | 11/1998 | Seki et al. | 341/155 |
| 6,404,372 B1 | | 6/2002 | Heithoff | |
| 6,795,001 B2 | * | 9/2004 | Roza | 341/143 |

(Continued)

OTHER PUBLICATIONS

International Search Report and Written Opinion mailed on Dec. 6, 2010, for international application No. PCT/US10/52316 filed on Oct. 12, 2010 (12 pages).

(Continued)

*Primary Examiner* — Khai M Nguyen
(74) *Attorney, Agent, or Firm* — Wilmer Cutler Pickering Hale and Dorr LLP

(57) ABSTRACT

Systems, devices, and methods for continuous-time digital signal processing and signal representation are disclosed. This includes a continuous-time analog-to-digital converter that is configured to receive an analog signal and convert it to a continuous-time digital signal without using a clock or any type of sampling. This A/D conversion can include a per-level representation and a per-edge representation of the analog signal to produce a digital signal. The digital signal can then be processed in a continuous-time signal processor. The continuous time signal representation and processing can have benefits such a providing filters in high frequency applications where sampling is not practical.

20 Claims, 14 Drawing Sheets

(51) Int. Cl.
  *H03M 1/08* (2006.01)
  *H04R 25/00* (2006.01)
  *H03M 1/36* (2006.01)
  *H03M 1/74* (2006.01)

(52) U.S. Cl.
  CPC ............ *H03M 1/1215* (2013.01); *H04R 25/00* (2013.01); *H03M 1/0631* (2013.01); *H03M 1/125* (2013.01); *H03M 1/127* (2013.01); *H03M 1/361* (2013.01); *H03M 1/74* (2013.01)

(56) References Cited

U.S. PATENT DOCUMENTS

| | | | |
|---|---|---|---|
| 7,075,466 B1 * | 7/2006 | Woodall et al. | 341/131 |
| 7,132,972 B2 * | 11/2006 | Tsividis | 341/158 |
| 7,280,059 B1 * | 10/2007 | Tsividis | 341/126 |
| 7,405,688 B2 | 7/2008 | Prestros | |
| 7,532,147 B2 | 5/2009 | Teo et al. | |
| 7,656,339 B2 | 2/2010 | Chmelar | |
| 7,696,915 B2 | 4/2010 | Chmelar et al. | |
| 8,749,421 B2 | 6/2014 | Kurchuk et al. | |
| 2003/0025624 A1 | 2/2003 | Roza | |
| 2006/0092061 A1 * | 5/2006 | Jensen | 341/143 |
| 2008/0284464 A1 * | 11/2008 | Bucossi et al. | 326/26 |
| 2009/0096650 A1 * | 4/2009 | Tsividis | 341/155 |

OTHER PUBLICATIONS

Schell, B. et al. "A Continuous-Time ADC/DSP/DAC System With No Clock and With Activity-Dependent Power Dissipation," IEEE Journal of Solid-State Circuits, vol. 43, No. 11, Nov. 2008, pp. 2472-2481.

* cited by examiner

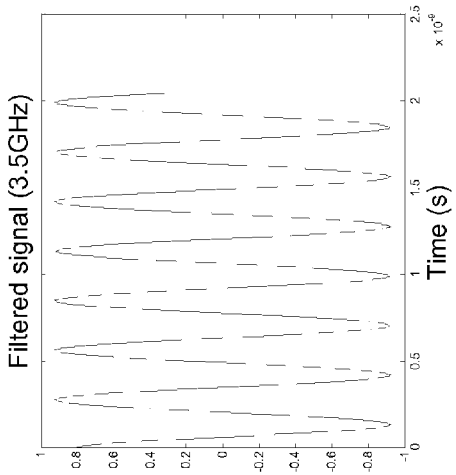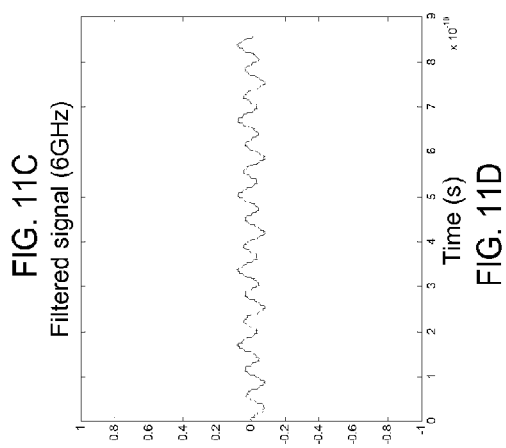
FIG. 11A
FIG. 11C
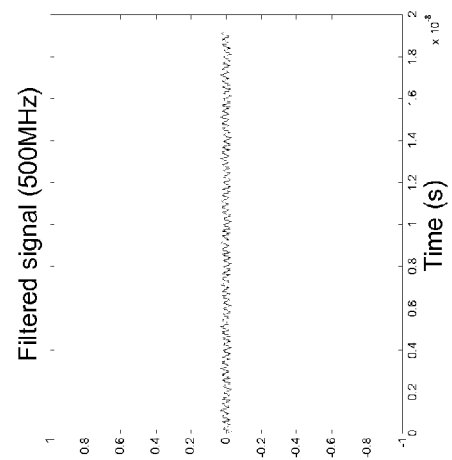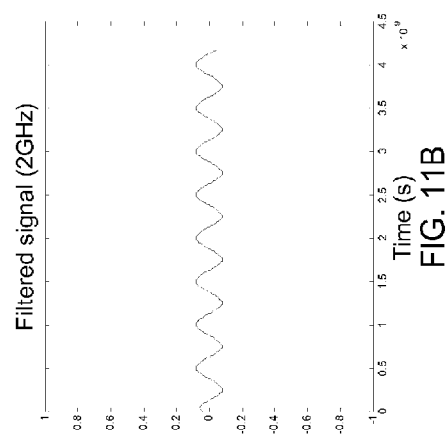
FIG. 11B
FIG. 11D

SYSTEMS, DEVICES, AND METHODS FOR CONTINUOUS-TIME DIGITAL SIGNAL PROCESSING AND SIGNAL REPRESENTATION

CROSS-REFERENCE TO RELATED APPLICATIONS

This application is a continuation of and claims the benefit under 35 U.S.C. §120 of U.S. application Ser. No. 13/501,197, entitled "Systems, Devices, and Methods for Continuous-Time Digital Signal Processing and Signal Representation," filed on Nov. 21, 2012, which is a U.S. National Phase Application under 35 U.S.C. §371 of International Patent Application No. PCT/US2010/052316 filed Oct. 12, 2010, which claims benefit under 35 U.S.C. §119(e) of U.S. Provisional Patent Application No. 61/250,749, entitled "Systems, Devices, and Methods for Continuous-Time Digital Signal Processing and Signal Representation," filed Oct. 12, 2009, each of which is hereby incorporated by reference herein in its entirety.

STATEMENT REGARDING FEDERALLY SPONSORED RESEARCH OR DEVELOPMENT

This invention was made with government support under CCF-07-01766 awarded by the National Science Foundation (NSF). The government has certain rights in the invention.

FIELD OF THE DISCLOSURE

This disclosure relates to a system, device, and method for signal processing and signal representation.

BACKGROUND

Converting analog signals into digital signals is typically done using discrete-time sampling in an analog to digital converter. This involves measuring the signal at regular, discrete time intervals. There are a number of disadvantages in using discrete-time digital signals. For example, in conventional discrete-time digital signal processors (DSP), the clock signal that triggers the sampling runs at a frequency that is at least twice the highest frequency of interest in a signal. This clock has to run continually at that frequency even if there is no signal or there is no high-frequency component that needs to be processed, and this can result in a significant waste of power.

In addition, conventional DSPs suffer from aliasing and quantization error. Aliasing occurs because the input signal mixes with the clock frequency, resulting in distortion that is present when the signal is reconstructed from the samples. Quantization error is produced by the inaccuracies inherent in turning the continuous amplitude range of an analog input signal into the discrete levels of a digitized signal, and these errors can be spread across all frequencies in a conventional DSP. Techniques such as dithering and non-uniform sampling may reduce or modify one or both of these undesired effects, but residual aliasing and/or quantization noise typically remains even after applying such techniques.

SUMMARY

In some embodiments, a system for continuous-time signal processing is disclosed. The continuous-time signal processing system includes a continuous-time analog-to-digital converter that is configured to receive an analog input signal, determine time points at which the analog input signal crosses each quantization level of a plurality of defined quantization levels, produce a digital signal for each quantization level, the digital signal having a value that changes at the determined time points of the quantization level, and produce, for the digital signal of at least one of the quantization levels, a plurality of transition signals based on transitions of the value of the digital signal, and a continuous-time digital signal processor coupled to the continuous-time analog-to-digital converter and configured to process the plurality of transition signals of each quantization level to produce processed digital signals.

In certain embodiments, a method for continuous-time signal processing is disclosed that includes receiving an analog input signal at a continuous-time analog-to-digital converter, determining time points at which the analog input signal crosses each quantization level of a plurality of defined quantization levels, producing a digital signal for each quantization level, the digital signal having a value that changes based on the analog input signal crossing the quantization level, producing, for the digital signal of at least one of the quantization levels, a plurality of transition signals based on transitions of the value of the digital signal, and processing the plurality of transition signals of each quantization level in a continuous-time digital signal processor to produce processed digital signals.

In yet other embodiments, a wide-band receiver system is disclosed. This system includes a low noise amplifier configured to receive and amplify an analog input signal, a continuous-time analog-to-digital converter that is configured to receive an analog input signal, determine time points at which the analog input signal crosses each quantization level of a plurality of defined quantization levels, produce a digital signal for each quantization level, the digital signal having a value that changes at the determined time points of the quantization level, and produce, for the digital signal of at least one of the quantization levels, a plurality of transition signals based on transitions of the value of the digital signal, a continuous-time digital signal processor coupled to the continuous-time analog-to-digital converter and configured to process the plurality of transition signals of each quantization level to produce processed digital signals, an analog summation circuit configured to convert the processed digital signals into analog signals and sum the analog signals to produce an analog output signal, and an asynchronous detector coupled to receive the analog output signal from the summation circuit and convert the analog output signal into a digital output signal.

DESCRIPTION OF DRAWINGS

FIGS. 11A-11D illustrate simulation results in accordance with some embodiments of the disclosed subject matter;

DETAILED DESCRIPTION

In accordance with the disclosed subject matter, systems, devices, and methods for continuous-time digital signal processing and signal representation are disclosed.

A continuous-time digital system that processes and filters signals in the digital domain without the use of sampling or a synchronizing clock is described. The use of a continuous-time digital system can offer many advantages over conventionally sampled digital systems such as providing digital signal processing at higher frequencies, reduced power consumption, reduced aliasing to no aliasing, and lower quantization error. In a continuous-time digital system, the input signal's amplitude rather than a sampling clock can determine when next change in the signal occurs. To produce a continuous-time digital signal, a continuous-time analog-to-digital converter (ADC) tracks the analog input signal and compares the analog input signal against quantization thresholds. These quantization thresholds can be predefined amplitude values against which the input signal is compared. A digital output, called a token, is produced whenever the input crosses a quantization level. The token can indicate information such as the time of the change and the amplitude of the change. The timing information can be relayed inherently in the composition of the digital output, in some embodiments, such that the changes in quantization values correspond to the crossings of quantization thresholds.

Figure 1:
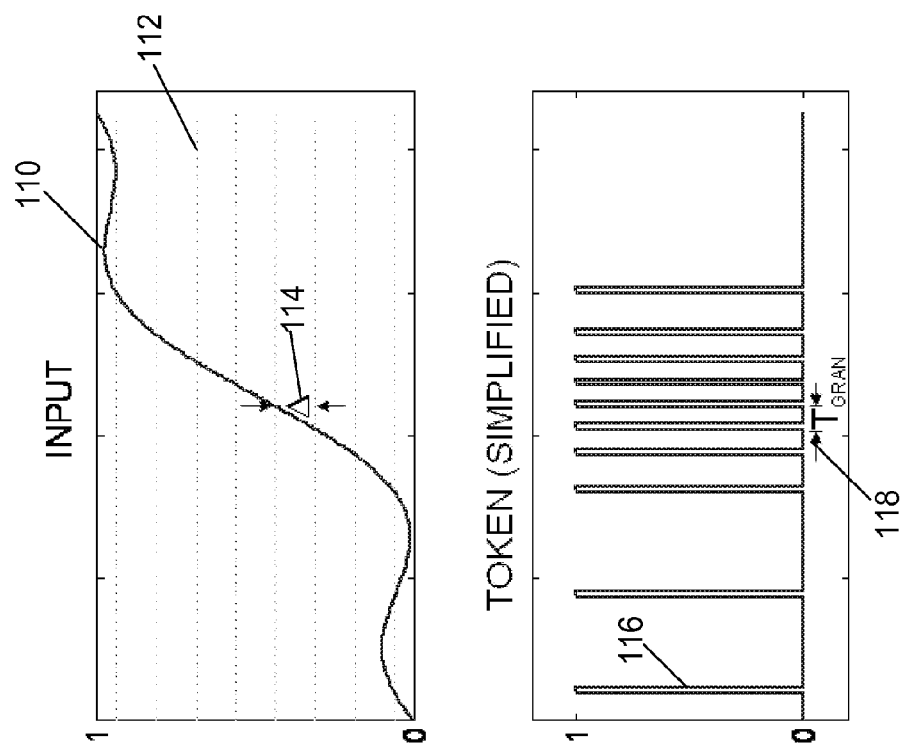
FIG. 1 illustrates an analog input and tokens in accordance with some embodiments of the disclosed subject matter.

FIG. 1 illustrates an analog input and tokens in accordance with certain embodiments of the disclosed subject matter. In FIG. 1, an analog input signal 110 crosses a number of quantization thresholds (or "quantization levels") 112, with Δ 114 being the distance between quantization thresholds 112, which can be chosen to be uniform or non-uniform depending upon the particular application and characteristics of the analog input signal 110.

A token 116, e.g., a signal spike, represents the time point at which a quantization level is crossed by the analog input signal 110. The token can be implemented in a variety of fashions to indicate the continuous-time digital signal. The token 116 is used to illustrate indications of quantization events. The minimum duration between tokens or granularity time, $T_{GRAN}$ 118, represents the minimum amount of time for continuous-time digitization without problems such as distortion and/or data loss. In fact, the timing between tokens is important for accurate signal representation, because information can be lost or distorted if changes in the analog signal occur at a frequency that is faster than the minimum processing time of the system.

The granularity time is a design constraint because it determines the upper bounds of the frequency operating range of a continuous-time digital device. In some embodiments, the granularity timing constraint can be alleviated by splitting the continuous-time digital signal representation of an input signal into multiple digital signals. The multiple digital signals can then be processed in parallel separately. For a multiple signal representation of an input signal, the splits can represent one or more quantization level changes with one or more signals. For example, each quantization level can be represented by an individual signal or two quantization levels can be represented by an individual signal.

The granularity time can be further extended by splitting each of the multiple digital signals into two or more signals. This splitting of each of the continuous-time digital signals can be done by having one signal represent rising edges and a second signal represent falling edges of the digital signal. For example, an upward edge signal changes when there is a rising edge change due to an upward crossing of a quantization threshold, and the upward edge signal only changes again when there is a second upward crossing of a quantization threshold. Likewise, a downward edge signal changes when there is a falling edge change due to downward crossing of the same quantization threshold, and the downward edge signal only changes a second time when there is a second downward crossing of the quantization threshold. The splitting of the digital signals in this fashion allows the processing of quantization threshold changes to be between two upward crossings or two downward crossings, which will be a longer period of time than between an upward and a downward crossing (or vice-versa) of the same quantization threshold. This alleviates the granularity constraint because the processing of multiple crossings can be implemented in parallel. The granularity constraint still exists in each separate split signal, but by splitting the signal in this manner, the effective granularity constraint for the system is reduced depending on how the signals are split.

Figure 2:
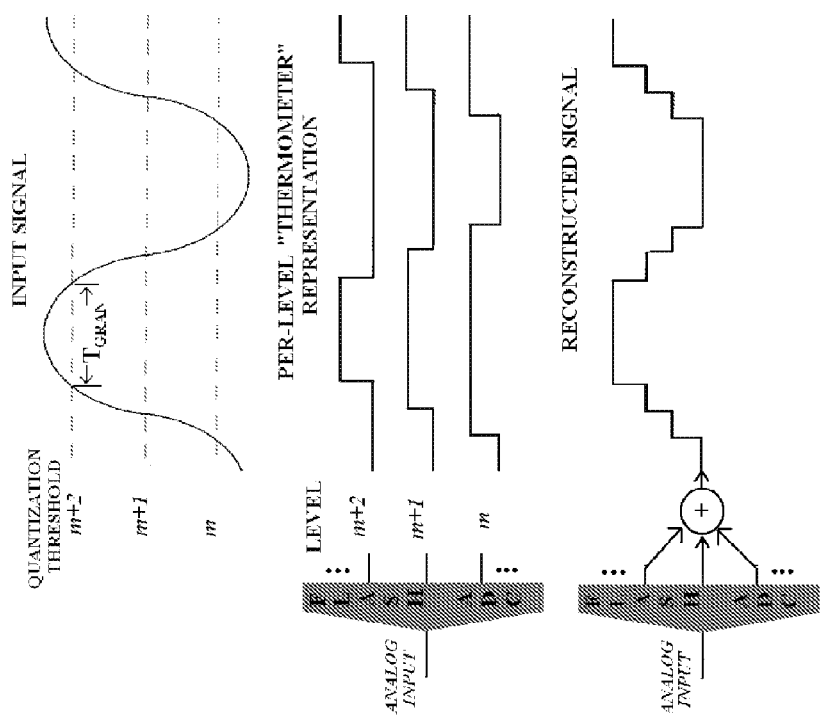
FIG. 2 illustrates a per-level thermometer representation with hardware in accordance with some embodiments of the disclosed subject matter.

In one embodiment, an input signal is compared against $2^n$ quantization levels and one or more output signals can digitally represent the input signal. The input signal can be split into $2^n$ signals, each corresponding to a single level, and digitally indicate when that level has been crossed, where n is the number of bits needed for binary representation of the signal. One way of splitting the signal into the $2^n$ signals is using a per-level representation. One type of per-level representation is a "thermometer" representation, in which a single level line goes high when the input signal passes the level threshold in an increasing direction and goes low when the input signal passes the level threshold in a decreasing direction. FIG. 2 illustrates a per-level thermometer representation in accordance with certain embodiments. As shown, the m level line goes high when the input signal crosses the level line in the increasing direction and goes down when the input signal crosses the level line in the decreasing direction.

Various circuits can be used to implement such a per-level representation, for example, a flash-based analog-to-digital converter (ADC). This flash ADC (also known as a direct conversion ADC) uses a linear voltage ladder with a comparator at each "rung" of the ladder to compare the input voltage to successive reference voltages. The flash ADC can be implemented using logic such as flip-flops to reduce the number of comparators that are needed to make the comparisons. Other types of ADCs can also be used, such as, for example, a successive-approximation ADC, a ramp-compare ADC, a Wilkinson ADC, an integrating ADC, a delta-encoded ADC, a pipeline ADC, a sigma-delta ADC, a time interleaved ADC, and a time-stretch ADC. With a per-level representation, the quantized input signal can be reconstructed by adding all the thermometer levels as shown in FIG. 2.

Using a per-level representation, or similar continuous-time parallel representation, the granularity time is established by the time between a quantization level being crossed twice, consecutively. This occurs, for example, at the peaks of the input signal as illustrated in FIG. 2 and the troughs (not shown). Parallel processing using per-level signal representation can accommodate signals in the megahertz (MHz) range (e.g., up to around 800 MHz with current technology). For input signals in the GHz range, additional techniques may be used. For example, the granularity constraint may be further loosened by using multiple signals to represent each per-level signal or level representation. In some embodiments, each per-level signal is represented by two or more transition signals, such as per-edge signals. For example, the m level line would further be separated into two separate per-edge signals—a rising edge signal and a falling edge signal.

As noted above, uniform or non-uniform spaced quantization levels can be used. For example, a non-linear ADC with non-uniformly spaced quantization levels can be used to generate the per-edge signals, with level spacing chosen according to the application and input signal properties. Filter coefficients at each level of a subsequent digital filter stage (e.g., in a continuous-time digital signal processor) can be appropriately scaled to achieve non-equal level weights or to alter the transfer characteristic due to the non-linearity of the ADC.

Figure 3A:
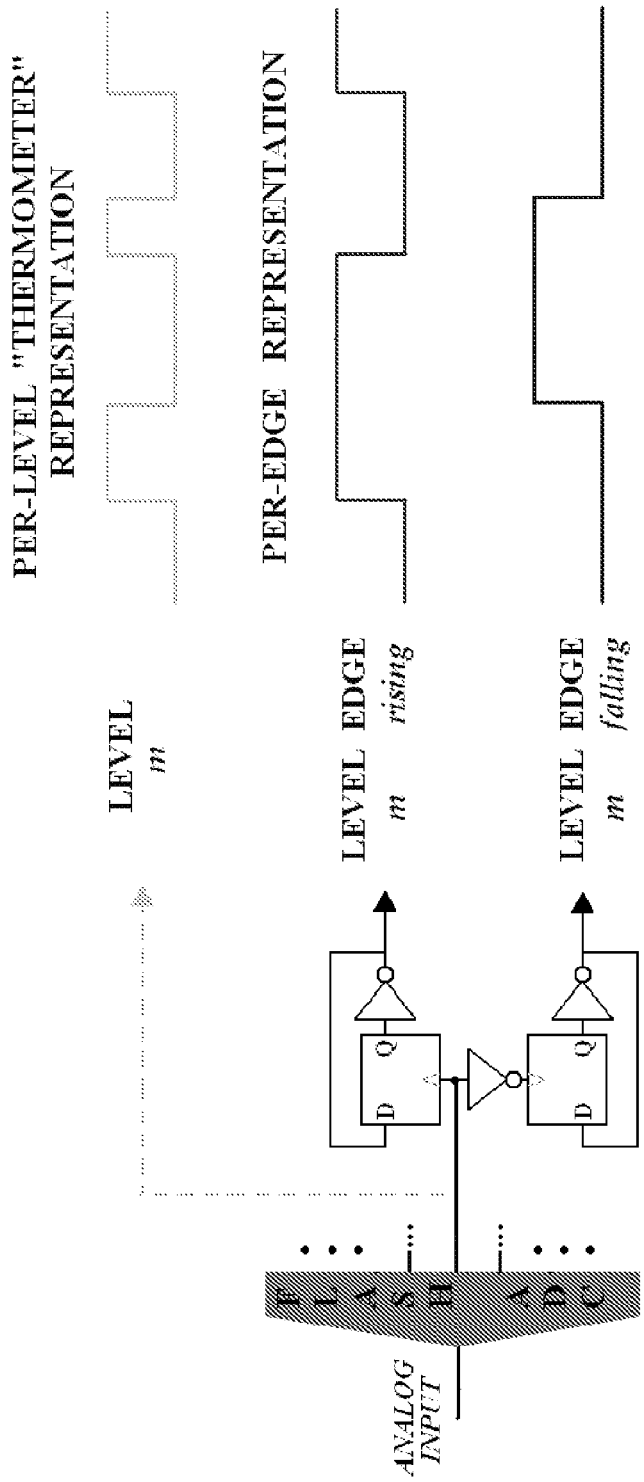
FIG. 3A illustrates a continuous-time analog-to-digital converter (ADC) employing a per-edge signal representation having two transition signals for each level, in accordance with some embodiments of the disclosed subject matter.

An example of a per-edge representation of the per-level signals is shown in FIG. 3A, in accordance with certain embodiments of the disclosed subject matter. As shown, the split can be accomplished by implementing a rising edge signal and a falling edge signal. The rising-edge signal inverts every time a level signal switches to a "1". The falling-edge signal switches every time a level switches to a "0". The input signal can be reconstructed by taking the logical XOR (exclusive OR) of the rising and falling edge signals at each level and adding them. In certain embodiments, the per-edge signal can be produced with T flip-flops, which are triggered with either a positive or a negative edge. A T flip-flop toggles every time an appropriate edge is supplied, and can be made with a D-type flip-flop, the inverted output of which is fed to its input. In some embodiments of the per-edge signal representation, the timing information is derived from the switching instances of the per-edge signal representations, rather than the value of these signals.

Figure 3B:
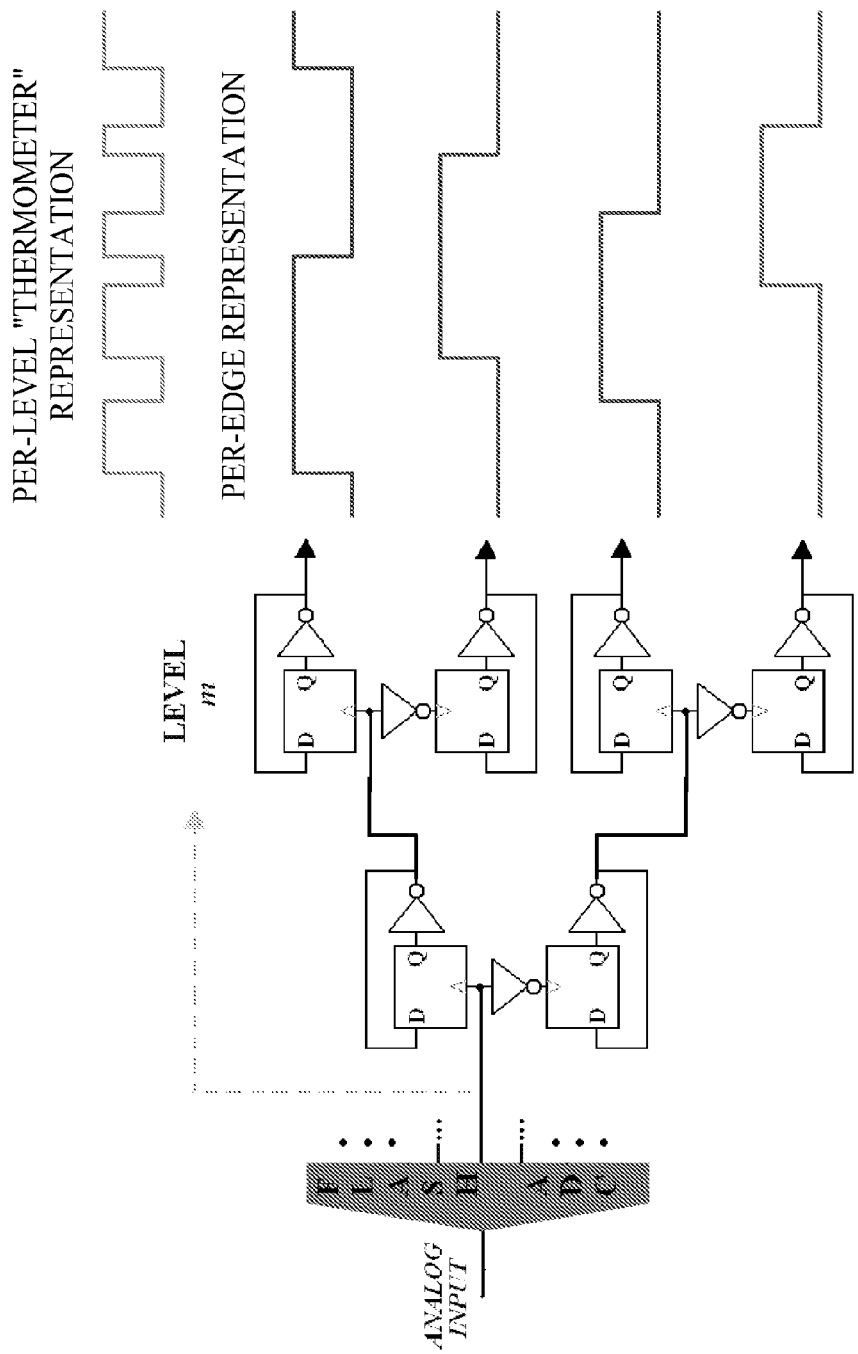
FIG. 3B illustrates a continuous-time ADC employing per-edge signal representation having four transition signals for each level, in accordance with some embodiments of the disclosed subject matter.

FIG. 3B represents an example of a per-edge representation using four transition signals. It shows that per-edge representation can be extended to any number of split signals. Considering PEN to be the number of per-edge signals required for representing one per-level signal, the $i^{th}$ per-edge signal toggles at the $i^{th}$ edge of the input within a sequence of PEN edges. The PEN number of per-edge signals is achieved by any combination of cascaded D-type flip-flops, such as, for example, two per-edge signals representing the alternating rising edges and two per-edge signals representing alternating falling edges, as in FIG. 3B.

The per-edge signal representation can allow for higher frequency input signal, because the granularity time is the time between when an input signal goes above a quantization level until the time that the signal goes above that level again. For granularity purposes, every other crossing is counted, because the signal is split into a representation of rising edges and a representation of falling edges, and each of these representations of the signal is processed in parallel. Each per-edge signal can be separately digitally filtered, thereby allowing digital signal processing of signals operating in the GHz frequency range. If there is a desire to work at even higher frequencies, a per-edge representation can be used to split, for example, the rising edge signal into two per-edge signals. This would have the effect of increasing the granularity constraint to every fourth crossing of a quantization threshold, as discussed above. Of course, circuitry implemented using the above-mentioned techniques can operate in other frequency ranges as well, such as the MHz range, the KHz range, and the Hz range or a combination or ranges depending on the embodiment.

Figure 3C:
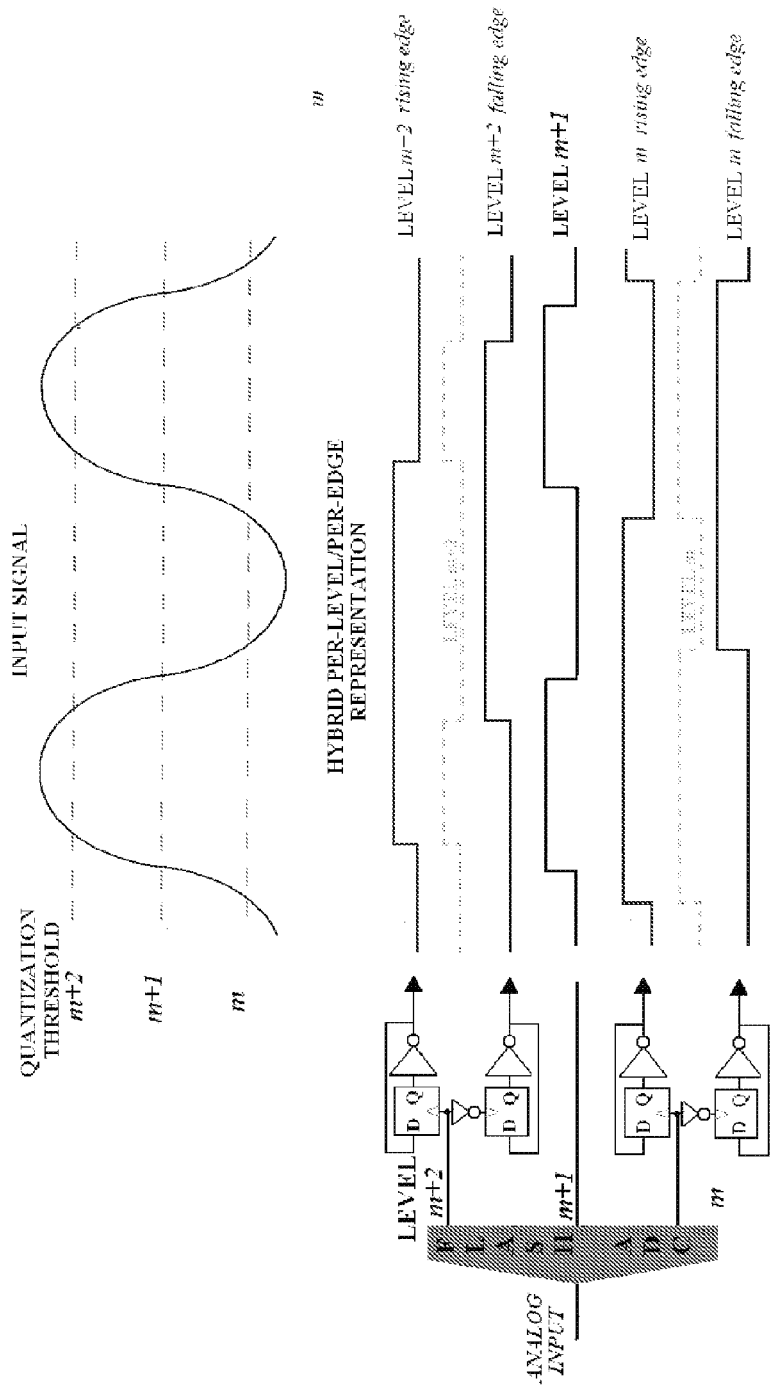
FIG. 3C illustrates a continuous-time ADC employing a hybrid signal representation that includes both per-level and per-edge representations.

Alternatively, as shown in FIG. 3C, a hybrid signal representation can be used, which utilizes both per-level and per-edge representations. For example, the per-level representation can be used for quantization levels corresponding to lower amplitudes, where the granularity time is less strict. For high amplitude quantization levels, where the granularity time is a design criterion, the per-edge encoding can be used. FIG. 3C illustrates example waveforms for a system where levels m and m+2 are encoded with per-edge representations and per-level encoding is used to represent level m+1.

It should be noted that in the examples shown in FIGS. 3A, 3B and 3C, the delay time from the output of the per-level ADC (e.g., flash ADC) to the final output of the continuous-time ADC is not the same for rising and falling edges, because an extra inverter is used in the falling-edge path. This delay difference, if not compensated, could degrade the performance of the system. To prevent such degradation, the circuit should be designed to keep the delay for each type of edge (i.e., each rising or falling edge transition signal) and level as close as possible. For example, a buffer could be included in the rising-edge path to make the delay closer to that of the falling-edge path.

Further hybrid architectures can use per-edge, per-level and binary signal representations. For example, the most significant bits of the binary representation of ADC levels can be processed in a binary manner. A primary, low-resolution ADC with relaxed time granularity constraints can be used to generate the binary signals. A sub-ranging, multi-bit ADC can be applied to a residue of the primary ADC to obtain per-level and per-edge signals corresponding to least significant bits. This reduces the number of per-level and per-edge filters composing the continuous-time digital signal processor. The extent to which parallelization is used can be dependent on the application and input signal statistics. The balance between different representations of a hybrid system depends on the speed specifications. For fast inputs, a high level of parallelization can be used involving mostly per-edge representation.

Figure 2A:
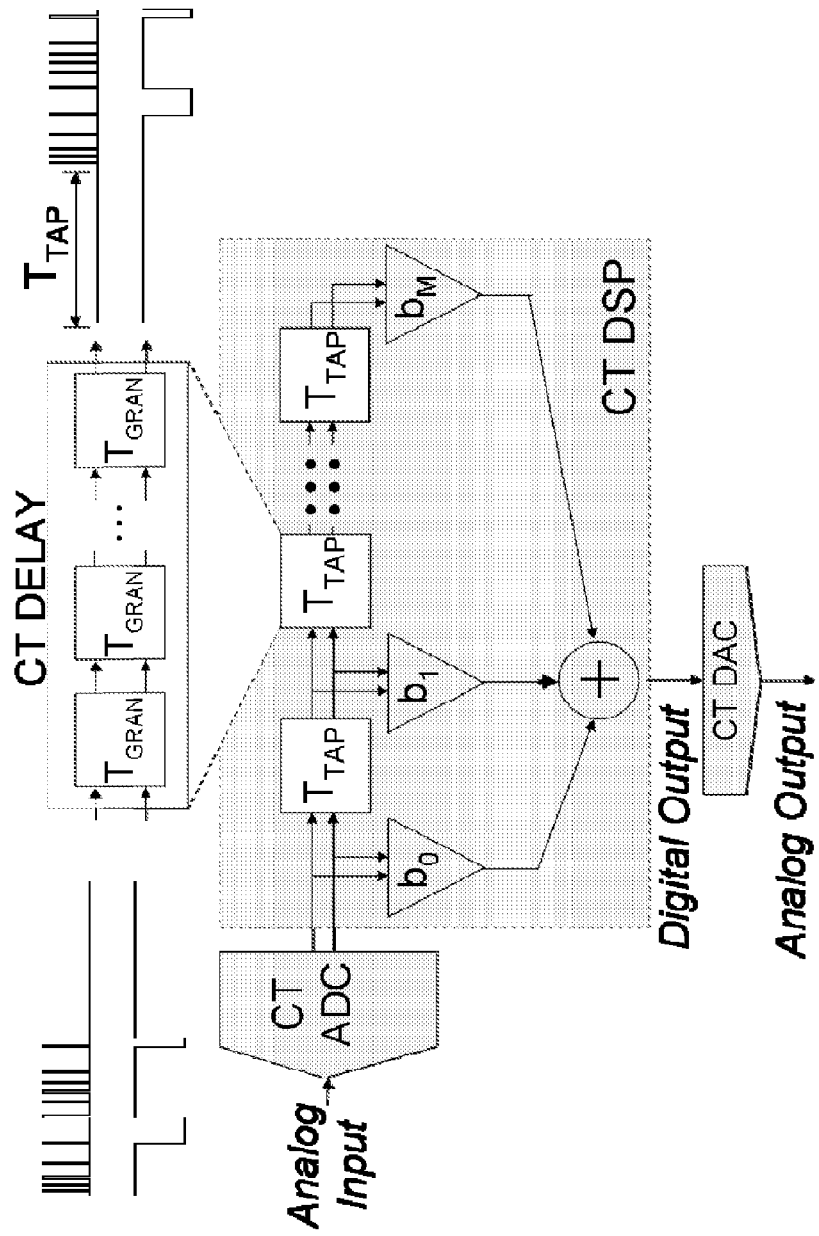
FIG. 2A illustrates a continuous-time DSP in accordance with some embodiments of the disclosed subject matter.
Figure 4:
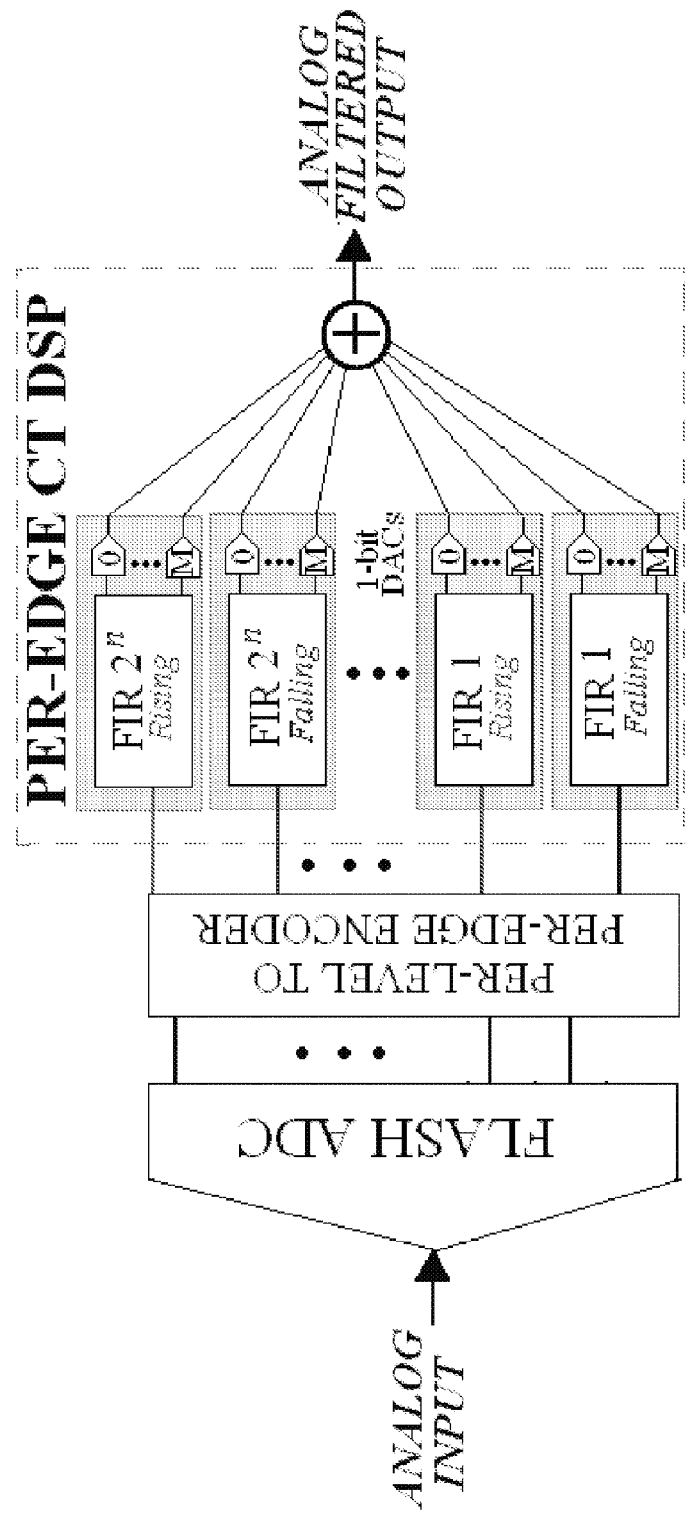
FIG. 4 illustrates a finite impulse response (FIR) filter implemented with a DSP in accordance with some embodiments of the disclosed subject matter.
Figure 5:
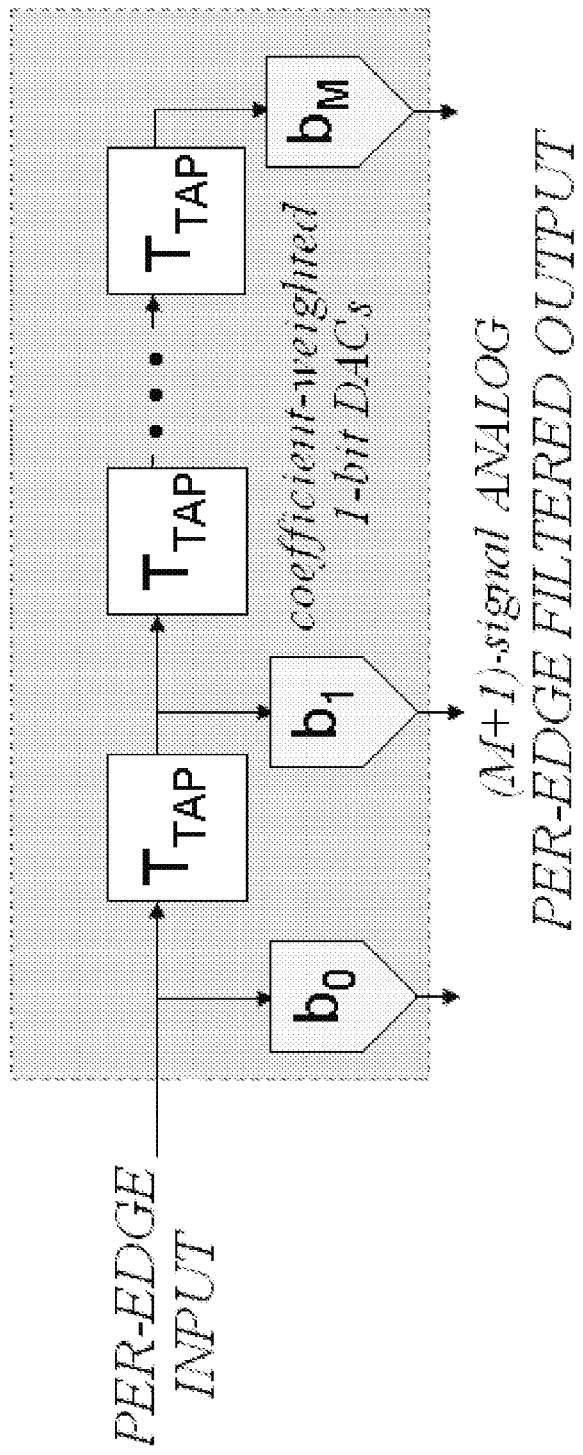
FIG. 5 illustrates a per-edge DSP in accordance with some embodiments of the disclosed subject matter.

A continuous-time DSP, in accordance with some embodiments, is described in the following section. The proposed representation, however, is not limited to the proposed implementation or an ultra wide band (UWB) application. In the proposed continuous-time (CT) DSP, each of the per edge signals is processed by a separate digital filter, which can be implemented with the structure of the DSP in FIG. 2A. For an n-bit per-edge ADC, there can be $2(2^n)$ individual filters. FIG. 4 illustrates a per-edge CT DSP implementing a finite impulse response (FIR) filter in accordance with certain embodiments. The digital signals can be processed with this FIR filter, for example, in the 1 Hz to 10 GHz range given current technology by processing the per-edge signals in parallel as described above. However, if the signals are digitally combined (e.g., using a summing device) to reconstruct the filtered output, the granularity problem can again arise. This can also arise when digital signals of several delayed paths have to be combined digitally, within a per-edge DSP illustrated in FIG. 5. To avoid this problem, the combining of signals can be performed in the analog domain using digital control.

Figure 6A:
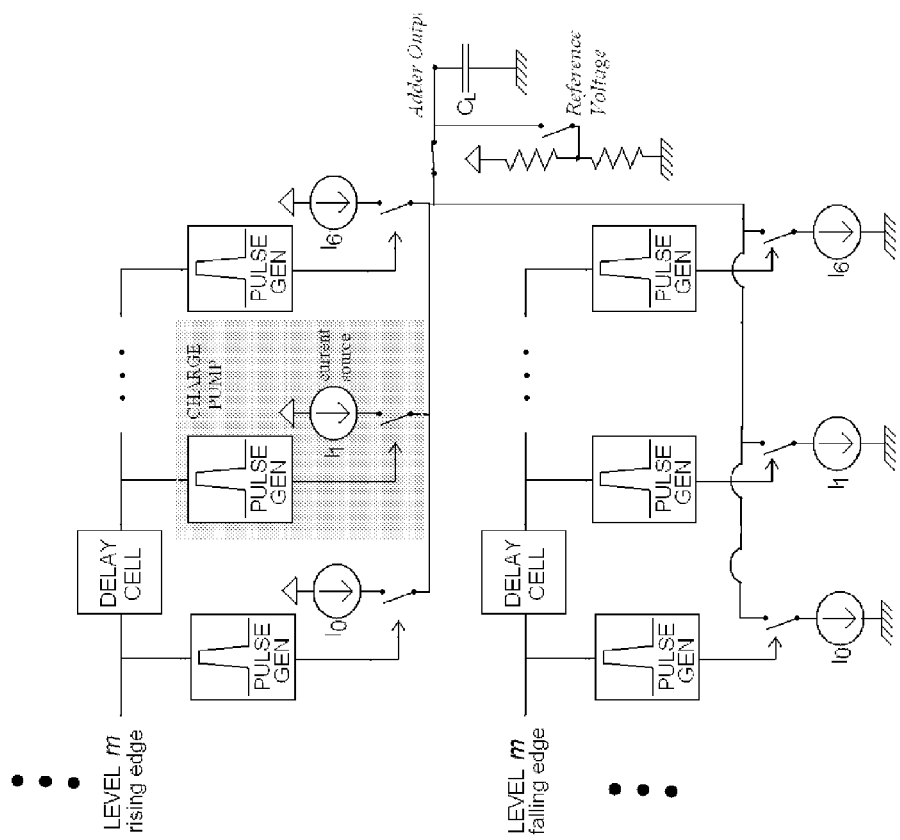
FIG. 6A illustrates a FIR filter implemented with charge pumps for per-edge signaling in accordance with some embodiments of the disclosed subject matter.

A digitally-controlled analog summing device can be implemented in numerous ways. In one embodiment, as shown in FIG. 6, each digital signal to be combined together controls a charge pump. A load capacitor is coupled to each of the charge pumps controlled by the various digital signals to be combined and stores the current value, which is measured by a charge level. The charge pumps can add and remove charge. When activated by the input signal for a positive value, the charge pump dumps charge on the load capacitor. To subtract a value, a digital input associated with a negative value activates a negative charge pump, which removes a set amount of charged from the load capacitor. These functionalities can be used to add and subtract value in parallel by separately modifying the charge value of the capacitor.

As shown in FIG. 6, the two per-edge signal representations can be combined into a single signal and a filter can be implemented using charge pumps to avoid the granularity constraint problems mentioned earlier. In this filter embodiment, an edge triggered charge pump can be implemented as a current source, which is activated by a pulse generator. The pulse generator can be used to generate a turn-on pulse, which switches the current source on to charge or discharge the capacitor. The filter is implemented by regulating the current source. The current ($I_k$) generated from the current source can be set according to the desired coefficient, $b_k$. The desired coefficients are used to weigh the different signals accordingly when combining in order to implement a digital filter. These coefficients can be changed in order to implement a different filter or to tune an existing filter, for example.

Such charge pumps can be placed at every tap of every per-edge FIR filter with the outputs of the filters coupled to the same load capacitor. The operation of an analog summing device can be as follows: when a rising-edge waveform of level m is received at a filter tap, the filter tap toggles in either direction which directs a charge pump to place a set amount of charge $Q_k$ on the capacitor, which increases the voltage by $C_L Q_k$ on the capacitor. Similarly, whenever the negative-edge waveform of level m is received at a filter tap, the tap toggles directing the charge pump to remove the charge $Q_k$, which brings the capacitor voltage down by $C_L Q_k$.

Figure 6B:
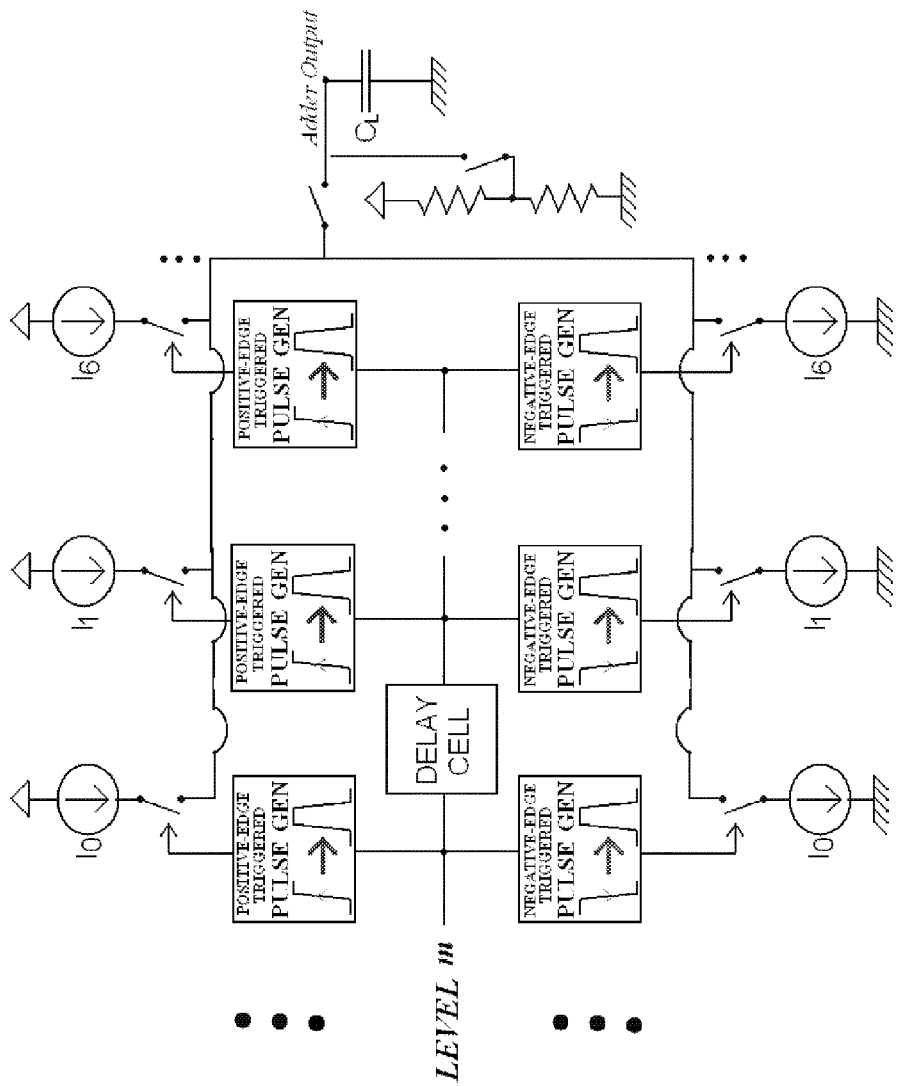
FIG. 6B illustrates a per-level signaling portion of a FIR filter implemented with charge pumps for hybrid signaling that includes both per-level and per-edge representations, in accordance with some embodiments of the disclosed subject matter.

FIG. 6B illustrates a per-level signaling portion of a FIR filter implemented with charge pumps for hybrid signaling that includes both per-level and per-edge representations, in accordance with some embodiments of the disclosed subject matter. In certain embodiments, a hybrid processor combines the structure in FIG. 6A for the per-edge signals and the structure in FIG. 6B for per-level signals, with both structures sharing a summing capacitor $C_L$. When the input signal crosses above a quantization level corresponding to a per-level signal, the rising edge of that signal triggers a positive-edge triggered pulse generator. The pulse generator turns on a positive current source, which accumulates charge onto the load capacitor $C_L$. Similarly, when the input crosses below that quantization level, a negative-edge triggered pulse generator activates, and charge is removed from the capacitor $C_L$.

Figure 7:
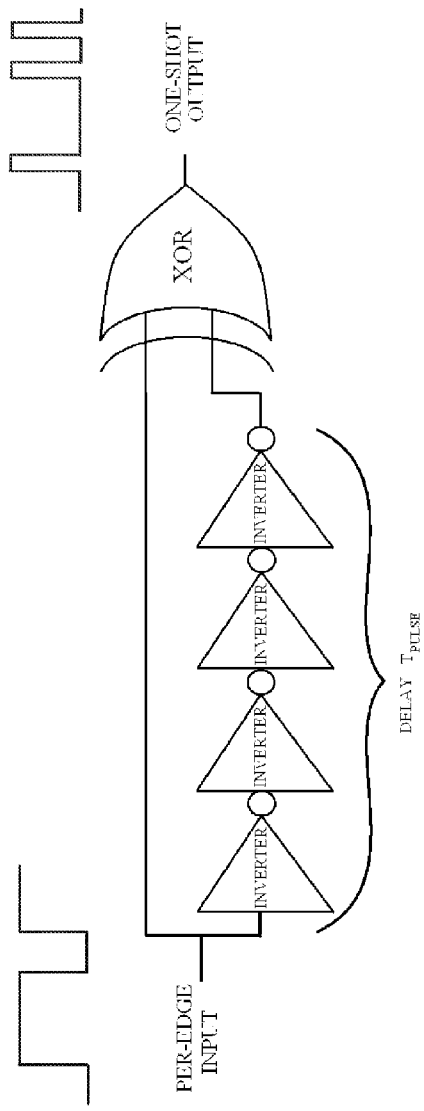
FIG. 7 illustrates a pulse generator circuit diagram in accordance with some embodiments of the disclosed subject matter.

FIG. 7 illustrates a pulse generator circuit for performing digitally-controlled analog summation in accordance with certain embodiments. The pulse generator (or one-shot circuit) can include a chain of inverters to provide a delay and an XOR logic device. The chain of inverters can be used to set the pulse width and therefore set the turn-on time for the current source, which controls the amount of charge added or subtracted from the capacitor. The pulse generation in a pulse generator can occur as follows in some embodiments. In a pulse generator in which all the signals are settled, the input and the delayed input have the same polarity, so the output of the XOR is a "0". As an example, consider an initial input state of "0". When the input toggles to "1", the output of the delay path remains "0" for a time $T_{PULSE}$. For the duration, the XOR output switches to a "1" since its input are of the opposite polarity, until the delayed path catches up to the input, bringing the XOR output back to "0". Similarly, a pulse is generated on a negative edge.

Figure 8:
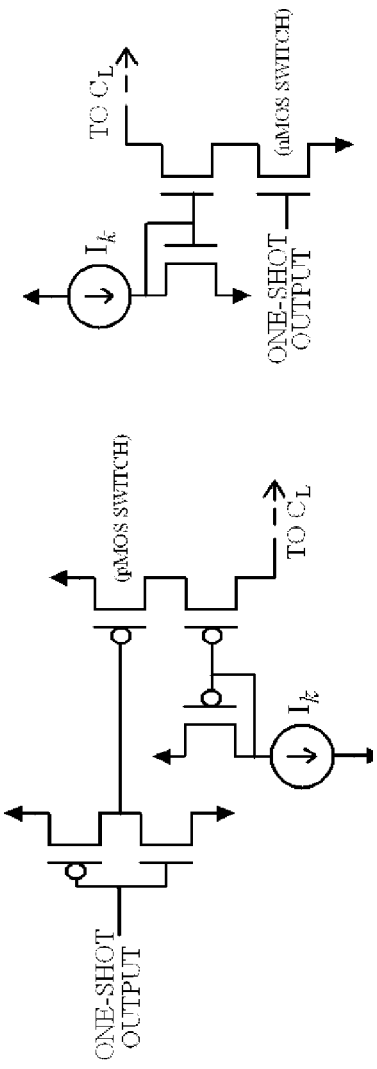
FIG. 8 illustrates charge-pump current sources in accordance with some embodiments of the disclosed subject matter.
Figure 9:
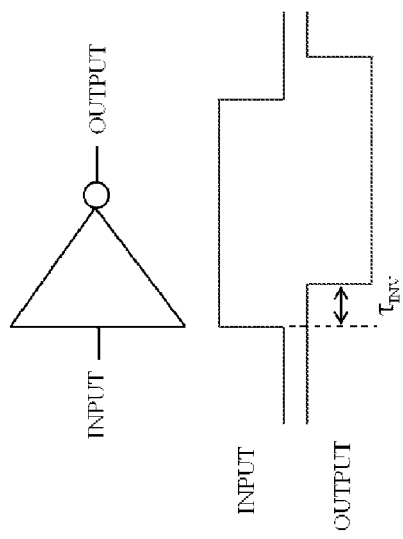
FIG. 9 illustrates a delay inverter in accordance with some embodiments of the disclosed subject matter.

FIG. 8 illustrates charge-pump current sources in accordance with certain embodiments of the disclosed subject matter. As shown in FIG. 8, the current source can be implemented using metal oxide semiconductor field effect transistors (MOSFET) arranged to provide a set current ($I_k$) as described above. The arrangement of the MOSFET switches determines whether the current is positive or negative. For negative coefficients a negative current source can be used. The MOSFETs can be connected so that a pulse from the pulse generator produces a current acting on the capacitor. The output of currents sources are coupled to the load capacitor. The amount of charge that accumulates on the capacitor can be determined using the following formula: $Q_k=(I_k)(T_{PULSE})$. If the tap delay is less than the period of the fastest input signal, a single delay cell can be used in the delay block, since only one token is processed at a time. If, however, the delay is longer, the delay block can be made up of granular delay cells. A basic inverter, shown in FIG. 9, is an example of a granular delay cell which delays the input by an inverter propagation time.

Continuous-time circuits and continuous-time signal processing can provide many benefits. For example, the power consumption of continuous-time circuits can be less than a comparable discrete digital system depending on the signal input. Further, a continuous-time DSP can reduce the impact of aliasing and quantization error on an outputted signal. In some embodiments, a continuous-time DSP can be used to implement an ultra-wideband (UWB) receiver, as discussed below.

Typical UWB receivers require inductors to filter out blocker signals, which corrupt the signal of interest. In such cases, inductors take up a major portion of the expensive chip area. In high frequency applications, such as an UWB receiver, a CT DSP can be used to digitally process signals that could not previously be processed. Conventional digital filters cannot operate in the GHz range, which is why inductors are used in many UWB receivers to filter out unwanted signals. The disclosed CT DSP can work in the GHz range which allows it to digitally filter out-of-band blocker signals and allows an UWB receiver to be designed without the use of inductors. Other applications are also possible, such as implementing filters and signal processing in mobile devices, in power converters, and other applicable devices.

Figure 10:
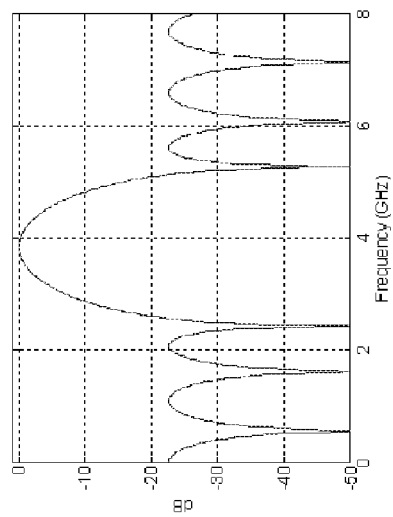
FIG. 10 illustrates a digital filter response in accordance with some embodiments of the disclosed subject matter.

FIG. 10 illustrates a digital filter response in accordance with certain embodiments of the disclosed subject matter. The filter response shows how a particular filter modifies an input signal of a particular frequency range. The filter response of FIG. 10 is that of a $6^{th}$ order filter designed to pass a bandwidth of 2 GHz around a center frequency of 3.5 GHz. The continuous-time ADC with the DSP can be used to implement this filter response and filter an input signal in order to filter out blocker signals and other unwanted noise. FIGS. 11A-11D illustrate how the filter of FIG. 10 operates on selected signals at different frequencies. FIGS. 11A, 11B, 11C, and 11D illustrate respective output signals at 500 MHz, 2 GHz, 3.5 GHz, and 6 GHz after filtering though the digital filter. As shown, signals around 3.5 GHz are passed with little filtering. The other signals show in FIGS. 11A, 11B, and 11D are attenuated noticeably, and in many cases by more than 20 dB (1/10th the amplitude).

Figure 12A:
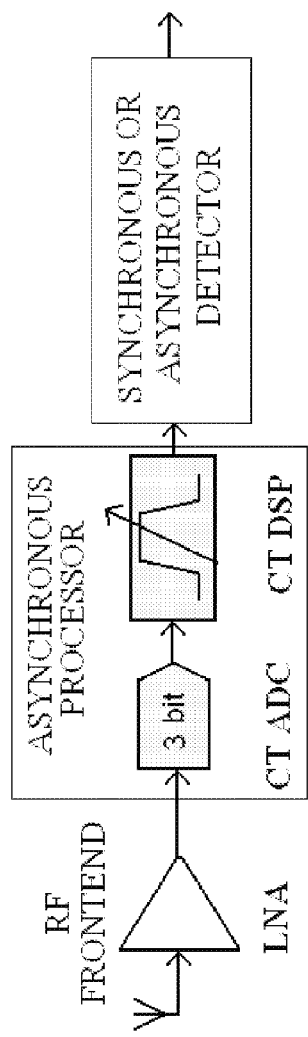
FIG. 12A illustrates an ultra-wideband receiver architecture, in accordance with some embodiments of the disclosed subject matter.
Figure 12B:
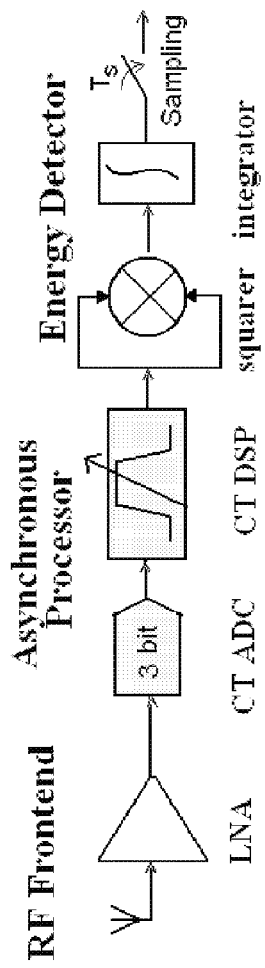
FIG. 12B illustrates an ultra-wideband receiver architecture having a detector with a squarer and integrator, in accordance with some embodiments of the disclosed subject matter.

FIG. 12A illustrates an ultra-wideband (UWB) receiver architecture based on a continuous-time implementation in accordance with certain embodiments. The UWB receiver can include a low noise amplifier (LNA), a continuous-time analog-to-digital converter (CT ADC), a continuous-time digital signal processor (CT DSP), and a synchronous or asynchronous detector. An asynchronous detector can generate and use variable processing start times—independent of a clock. An energy detector, for example, can include a mixer, followed by an integrator, the output of which is sampled with a clock according to the data rate, as shown in FIG. 12B. An asynchronous energy detector can optimize integration window start times, independent of a clock, for better detection.

In operation, a signal received by the UWB receiver typically includes the signal of interest, blockers, and noise. After the received signal is quantized and encoded with the CT ADC, the CT DSP can be configured such that the filter delays and coefficients are selected to pass the signal of interest and filter out the blockers. The tunability of the digital filter provides the ability to vary the frequency response for optimal blocker rejection and signal detection. Thus, the CT ADC and CT DSP can provide a tunable filter with a sharper cut-off than an inductor-based filter design. Consequently, the LNA can be built without a band-pass filter requiring a large inductor. The proposed CT DSP-based receiver, thus, offers the advantages of a small chip area and a variable frequency response for optimal signal receptions. Additionally, the CT DSP can be used in hearing aids and for power conversion applications in some embodiments. U.S. Pat. No. 7,132,972, entitled "Continuous-Time Digital Signal Generation, Transmission, Storage, and Processing", provides additional information regarding digital signal processing in continuous time and is hereby incorporated by reference herein in its entirety.

Other embodiments, extensions, and modifications of the ideas presented above are comprehended and should be within the reach of one versed in the art upon reviewing the present disclosure. Accordingly, the scope of the disclosed subject matter in its various aspects should not be limited by the examples presented above. The individual aspects of the disclosed subject matter, and the entirety of the disclosed subject matter should be regarded so as to allow for such design modifications and future developments within the scope of the present disclosure. The disclosed subject matter can be limited only by the claims that follow.

We claim:

1. A system for continuous-time signal processing comprising:
   a continuous-time analog-to-digital converter that is configured to:
      receive an analog input signal; and
      produce multiple digital signals representing the analog input signal;
   wherein the multiple digital signals include a first edge signal and a second edge signal associated with a corresponding quantization level of the plurality of quantization levels, the first edge signal associated with an upward crossing of the corresponding quantization level and the second edge signal associated with a downward crossing of the corresponding quantization level; and
   a continuous-time digital signal processor coupled to the continuous-time analog-to-digital converter and configured to process the first edge signal and the second edge signal to provide a processed digital signal.

2. The system of claim 1, wherein the multiple digital signals include a level signal associated to one of the plurality of quantization levels, wherein a value of the level signal is configured to switch from a first value to a second value in accordance with the upward crossing of the quantization level.

3. The system of claim 1, wherein the multiple signals include at least one binary signal representing at least one quantization level.

4. The system of claim 1, further comprising an analog summation circuit configured to convert the processed digital signals into analog signals and sum the analog signals to produce an analog output signal.

5. The system of claim 4, wherein the analog summation circuit comprises a cascaded arrangement of delays and charge pumps to convert the processed digital signals into analog signals.

6. The system of claim 1, wherein the continuous-time digital signal processor comprises a finite impulse response filter to process the first edge signal and the second edge signal.

7. The system of claim 1, further comprising a low noise amplifier coupled to an input of the continuous-time analog-to-digital converter.

8. The system of claim 1, wherein the quantization levels are uniformly spaced.

9. A method for continuous-time signal processing comprising:
   receiving an analog input signal at a continuous-time analog-to-digital converter;
   producing a digital signal for each quantization level of a plurality of defined quantization levels, the digital signal having a value that changes based on the analog input signal crossing the quantization level;
   producing, for the digital signal of at least one of the quantization levels, a plurality of transition signals based on transitions of the value of the digital signal; and
   processing the plurality of transition signals of each quantization level in a continuous-time digital signal processor to produce processed digital signals.

10. The method of claim 9, wherein the step of producing a plurality of transition signals for each digital signal comprises producing at least a first edge signal based on rising edges of the digital signal and at least a second edge signal based on falling edges of the digital signal.

11. The method of claim 10, further comprising producing a third edge signal and a fourth edge signal, wherein the first and third edges signals correspond to alternating rising edges of the digital signal and the second and fourth edge signals correspond to alternating falling edges of the digital signal.

12. The method of claim 9, wherein transition signals are only produced for the digital signals of a predetermined number of higher-amplitude quantization levels.

13. The method of claim 9, wherein transition signals are produced for the digital signal of all quantization levels.

14. The method of claim 9, further comprising:
converting the processed digital signals into analog signals; and
summing the analog signals to produce an analog output signal.

15. The method of claim 14, wherein the processed digital signals are converted into analog signals using a cascaded arrangement of delays and charge pumps.

16. The method of claim 9, wherein the processing of the digital signal or transition signals of each quantization level in the continuous-time digital signal processor comprises finite impulse response filtering.

17. A continuous-time signal processor, configured to be deployed in a biomedical application, comprising:
a continuous-time analog-to-digital converter that is configured to:
receive an analog input signal;
produce a digital signal for each quantization level of a plurality of defined quantization levels, the digital signal having a value that changes at the determined time points of the quantization level, and produce, for the digital signal of at least one of the quantization levels, a plurality of transition signals based on transitions of the value of the digital signal; and
a continuous-time digital signal processor coupled to the continuous-time analog-to-digital converter and configured to process the plurality of transition signals of each quantization level to produce processed digital signals.

18. The continuous-time signal processor of claim 17, wherein the plurality of transition signals comprises at least a first edge signal based on rising edges of the digital signal and at least a second edge signal based on falling edges of the digital signal.

19. The continuous-time signal processor of claim 17, further comprising a low noise amplifier configured to receive and amplify an analog signal to provide the analog input signal to the continuous-time analog-to-digital converter.

20. The continuous-time signal processor of claim 17, wherein the biomedical application comprises hearing aids.

* * * * *